(12) United States Patent
Lee et al.

(10) Patent No.: US 11,430,677 B2
(45) Date of Patent: Aug. 30, 2022

(54) WAFER TAPING APPARATUS AND METHOD

(71) Applicant: Taiwan Semiconductor Manufacturing Co., Ltd., Hsinchu (TW)

(72) Inventors: Chien-Yi Lee, Hsinchu (TW); Wen-Kuei Liu, Xinpu Township (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/360,505

(22) Filed: Mar. 21, 2019

(65) Prior Publication Data

US 2020/0135511 A1 Apr. 30, 2020

Related U.S. Application Data

(60) Provisional application No. 62/752,776, filed on Oct. 30, 2018.

(51) Int. Cl.
*B32B 37/08* (2006.01)
*H01L 21/683* (2006.01)
*H01L 21/67* (2006.01)
*G01N 21/95* (2006.01)
*G06T 7/00* (2017.01)

(52) U.S. Cl.
CPC ... *H01L 21/67132* (2013.01); *G01N 21/9501* (2013.01); *G06T 7/0008* (2013.01); *H01L 21/67288* (2013.01); *H01L 21/6836* (2013.01); *G06T 2207/20081* (2013.01); *G06T 2207/30148* (2013.01)

(58) Field of Classification Search
CPC ......... H01L 21/67132; H01L 21/67288; H01L 21/6836; H01L 22/20; H01L 21/67253; H01L 2221/68386
See application file for complete search history.

(56) References Cited

U.S. PATENT DOCUMENTS

| 5,930,654 | A | * | 7/1999 | Tohyama | .......... | H01L 21/67132 |
| | | | | | | 438/464 |
| 9,881,827 | B2 | * | 1/2018 | Kim | ..................... | B32B 37/0053 |
| 2007/0193671 | A1 | * | 8/2007 | Yamamoto | .......... | B32B 38/0004 |
| | | | | | | 156/64 |

(Continued)

FOREIGN PATENT DOCUMENTS

| CN | 108510472 A | 9/2018 |
| TW | 201219915 A | 5/2012 |
| TW | 201737376 A | 10/2017 |

*Primary Examiner* — Bradley Smith
*Assistant Examiner* — David J Goodwin
(74) *Attorney, Agent, or Firm* — Seed Intellectual Property Law Group LLP

(57) ABSTRACT

Wafer taping apparatuses and methods are provided for determining whether taping defects are present on a semiconductor wafer, based on image information acquired by an imaging device. In some embodiments, a method includes applying an adhesive tape on a surface of a semiconductor wafer. An imaging device acquires image information associated with the adhesive tape on the semiconductor wafer. The presence or absence of taping defects is determined by defect recognition circuitry based on the acquired image information.

20 Claims, 6 Drawing Sheets

(56) References Cited

U.S. PATENT DOCUMENTS

| | | | | |
|---|---|---|---|---|
| 2007/0284038 A1* | 12/2007 | Yamamoto | .......... | B29C 63/0013 |
| | | | | 156/297 |
| 2010/0038009 A1* | 2/2010 | Okuno | ................ | H01L 21/6836 |
| | | | | 156/64 |
| 2010/0078114 A1* | 4/2010 | Yamamoto | ........ | H01L 21/67132 |
| | | | | 156/379 |
| 2010/0147442 A1* | 6/2010 | Yamamoto | .............. | B32B 38/10 |
| | | | | 156/64 |
| 2010/0267219 A1* | 10/2010 | Kajiyama | .......... | B23K 26/0853 |
| | | | | 438/462 |
| 2011/0117706 A1* | 5/2011 | Nishio | .............. | H01L 21/67132 |
| | | | | 257/E21.502 |
| 2011/0275179 A1* | 11/2011 | Oomure | ............ | H01L 21/67132 |
| | | | | 428/354 |
| 2012/0085478 A1* | 4/2012 | Yamamoto | ........ | H01L 21/67132 |
| | | | | 156/379 |
| 2012/0312461 A1* | 12/2012 | Yamada | ............. | B65H 35/0013 |
| | | | | 156/230 |
| 2014/0238207 A1* | 8/2014 | Kaneshima | ....... | H01L 21/67132 |
| | | | | 83/102 |
| 2015/0367622 A1* | 12/2015 | Adachi | .................. | B32B 39/00 |
| | | | | 156/759 |
| 2016/0023861 A1* | 1/2016 | Ito | .............................. | C09J 5/00 |
| | | | | 156/192 |
| 2016/0347047 A1* | 12/2016 | Eguchi | ................ | H01L 21/6836 |
| 2017/0133249 A1* | 5/2017 | Kim | .................... | H01L 21/6836 |
| 2017/0213756 A1* | 7/2017 | Yoshida | .................. | H01L 22/12 |
| 2019/0252337 A1* | 8/2019 | Derderian | ............ | H01L 21/268 |
| 2019/0339060 A1* | 11/2019 | Ohba | ...................... | B05C 11/00 |
| 2019/0370955 A1* | 12/2019 | Zhang | ................. | G06K 9/6253 |

\* cited by examiner

WAFER TAPING APPARATUS AND METHOD

BACKGROUND

A variety of processes are performed in the fabrication of semiconductor devices. In some semiconductor fabrication processes, one or more surfaces of a semiconductor wafer are taped, for example, to protect electrical features on the surface of the semiconductor wafer or to provide mechanical support of the wafer during subsequent processing.

For example, in a wafer back grinding process, a back grinding tape may be applied to the front side of a wafer in order to protect the electrical features at the front side of the wafer from surface damage and/or contamination while the back side of the wafer is thinned by the back grinding process.

The tape is typically applied to the semiconductor wafer using a taping apparatus, which may include one or more rollers for pressing tape from a tape supply onto the surface of the wafer. However, certain taping defects may occur during the taping process, such as the formation of bubbles or wrinkles in the tape. Identification of such taping defects is typically reliant on a visual inspection performed by a human. That is, a human operator of the taping apparatus may look for taping defects by visually inspecting, in some cases with the aid of an optical microscopy device, the taped surface of the semiconductor wafer to ensure that the wafer is free of taping defects before releasing the wafer to be thinned by the back grinding process. The visual inspection by a human may introduce errors in the determination of the presence or absence of taping defects, since humans may misjudge or not see such defects. Moreover, since different humans may have different standards, vision, judgment, or the like, the determination of the presence or absence of taping defects may similarly be different for different human operators. Additionally, human inspection for taping defects may increase the production costs of semiconductor devices, due at least in part to the time it takes for a human operator to visually inspect the entire taped surface of the wafer for taping defects.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
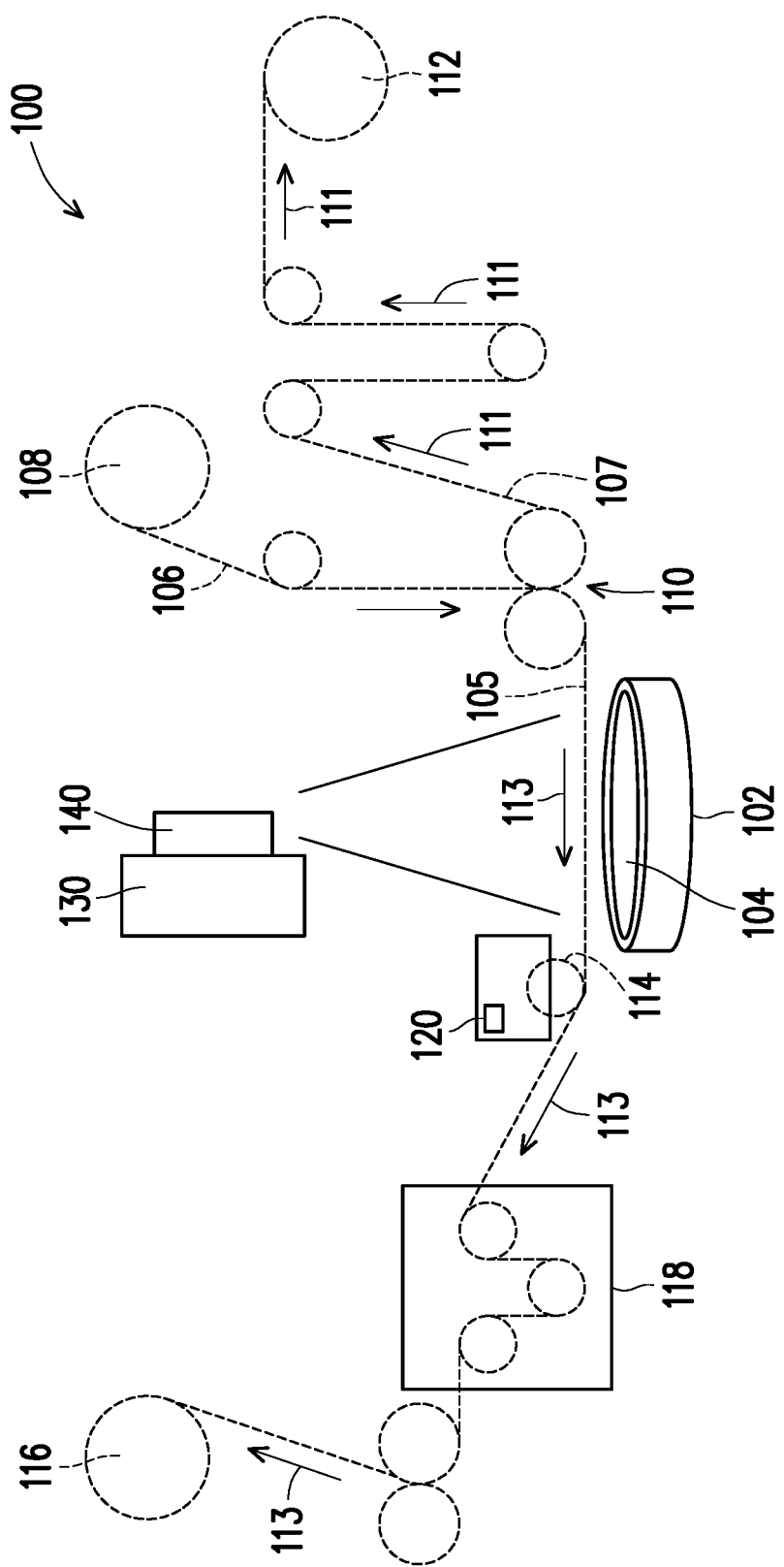
FIG. 1 is a schematic diagram illustrating a wafer taping apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein include wafer taping apparatuses and methods that facilitate automatic detection of taping defects (e.g., bubble defects and/or non-bubble defects), for example, by acquiring image information of a taped wafer using an imaging device, and analyzing the image information. In some embodiments, machine learning or artificial intelligence techniques are utilized in the analysis of the acquired image information in order to determine whether a taping defect is present on the taped wafer. This allows the wafer taping processes to proceed without visual inspection by a human, which reduces or eliminates human errors in the determination of taping defects, and may reduce manufacturing costs by reducing inspection time. Moreover, embodiments of the present disclosure may provide improved consistency in wafer taping processes.

FIG. 1 is a schematic diagram illustrating a wafer taping apparatus 100, in accordance with one or more embodiments of the present disclosure. The wafer taping apparatus 100 includes a wafer table 102 on which a wafer 104 is positioned during a wafer taping process. The wafer 104 may be a semiconductor wafer, which in some embodiments may include electrical features on a front side of the wafer 104. In some embodiments, the wafer 104 may be a monocrystalline silicon (Si) wafer, an amorphous Si wafer, a gallium arsenide (GaAs) wafer, or any other semiconductor wafer.

Tape 106 is supplied from a tape supply 108. The tape supply 108 may be a roll of tape 106, and the tape 106 may be provided to a nip roller 110, for example, by unwinding the tape 106 from the tape supply 108. In some embodiments, the tape 106 includes a release film or liner 107 which may be provided over an adhesive tape 105, for example, to prevent the adhesive tape 105 from sticking to itself. In some embodiments, the adhesive tape 105 includes an adhesive material (e.g., a glue material) on a backing. The backing and/or the liner 107 may be formed of any suitable material, including for example, polyolefin, polyvinyl chloride (PVC), polyethylene (PE) or the like. The adhesive material may be any adhesive material, for example, an acrylic material or any glue suitable to adhere to the wafer 104. In some embodiments, the tape 106 may be a back grinding tape suitable to protect the front side of the wafer 104 from damage by foreign matter, chipping, cracking, contamination or the like during a back grinding process.

In some embodiments, the nip roller 110 separates the liner 107 from the adhesive tape 105, and the liner 107 is supplied along a liner winding path 111 to a liner film wind 112, which winds the liner 107 after it has been separated from the adhesive tape 105. The adhesive tape 105 is advanced along a laminating path 113 to a desired position, e.g., to a position over the wafer 104 on the table 102. A tape wind 116 winds the adhesive tape 105, for example, after the adhesive tape 105 has been used or otherwise advanced over the table 102 and/or wafer 104, and the tape wind 116 receives the adhesive tape 105 after it passes through a removing head 118.

Taping of the wafer 104 is performed with the adhesive tape 105 positioned over the wafer 104 on the table 102. In some embodiments, the adhesive tape 105 may be positioned over a front side of the wafer 104, for example, to protect the electrical features on the wafer 104 during a subsequent back grinding process in which a back side of the wafer 104 is thinned to a desired dimension.

With the adhesive tape 105 suitably positioned over the wafer 104, a laminating roller 114 is used to apply the adhesive tape 105 to the wafer 104. In some embodiments, the laminating roller 114 is movable over the wafer 104 and applies the adhesive tape 105 to the wafer 104 by pressing the adhesive tape 105 to the wafer 104 as the laminating roller 114 moves over the surface of the wafer 104. The laminating roller 114 includes various electrical and/or mechanical features, such as motors, actuators, or the like which may be utilized to control the movements of the laminating roller 114 such as a speed of the laminating roller 114 and a laminating force (e.g., a downforce) applied by the laminating roller 114 while pressing the adhesive tape 105 to the wafer 104.

In some embodiments, the laminating roller 114 includes or is otherwise communicatively coupled to a laminating roller controller 120. The laminating roller controller 120 includes circuitry operable to control one or more parameters of the laminating roller 114. For example, in some embodiments, the laminating roller controller 120 includes circuitry operable to adjust the speed of the laminating roller 114 and the downforce applied by the laminating roller 114 while pressing the adhesive tape 105 to the wafer 104.

The wafer taping apparatus 100 further includes a laser head 130 and an image sensor 140, each of which may be positioned over the wafer 104, for example, when the wafer 104 is positioned on the table 102. In some embodiments, the laser head 130 is operable to cut the adhesive tape 105 after the adhesive tape 105 has been applied to the wafer 104. The image sensor 140 is operable to acquire an image of the adhesive tape 105 once it has been applied to the wafer 104. In some embodiments, the image sensor 140 acquires one or more images of the adhesive tape 105 after the adhesive tape has been cut, for example, by the laser head 130.

The image sensor 140 may be any image sensor capable of detecting image information, for example, image information associated with the adhesive tape 105 and the wafer 104, and in various embodiments, the image sensor 140 may be an analog or a digital image sensor capable of detecting image information in the form of electromagnetic radiation such as light that is reflected by an object (e.g., the adhesive tape 105 on the wafer 104) in an image scene. In some embodiments, the image sensor 140 is a charge-coupled device (CCD) image sensor operable to acquire image information associated with the adhesive tape 105 and the wafer 104.

In some embodiments, the image sensor 140 is attached to the laser head 130. For example, the image sensor 140 may be mounted on a surface, such as a side surface, of the laser head 130, and the image sensor 140 may have an unobstructed view of the wafer 104 and the adhesive tape 105 on the wafer 104. In various embodiments, the laser head 130 may be movable and may include various electrical and/or mechanical features, such as motors, actuators, or the like to move the laser head 130 in any direction and to any position suitable to cut the adhesive tape 105. Similarly, in some embodiments, the laser head 130 may be movable to orient the image sensor 140 over the adhesive tape 105 and wafer 104 in order to acquire suitable image information.

Figure 2:
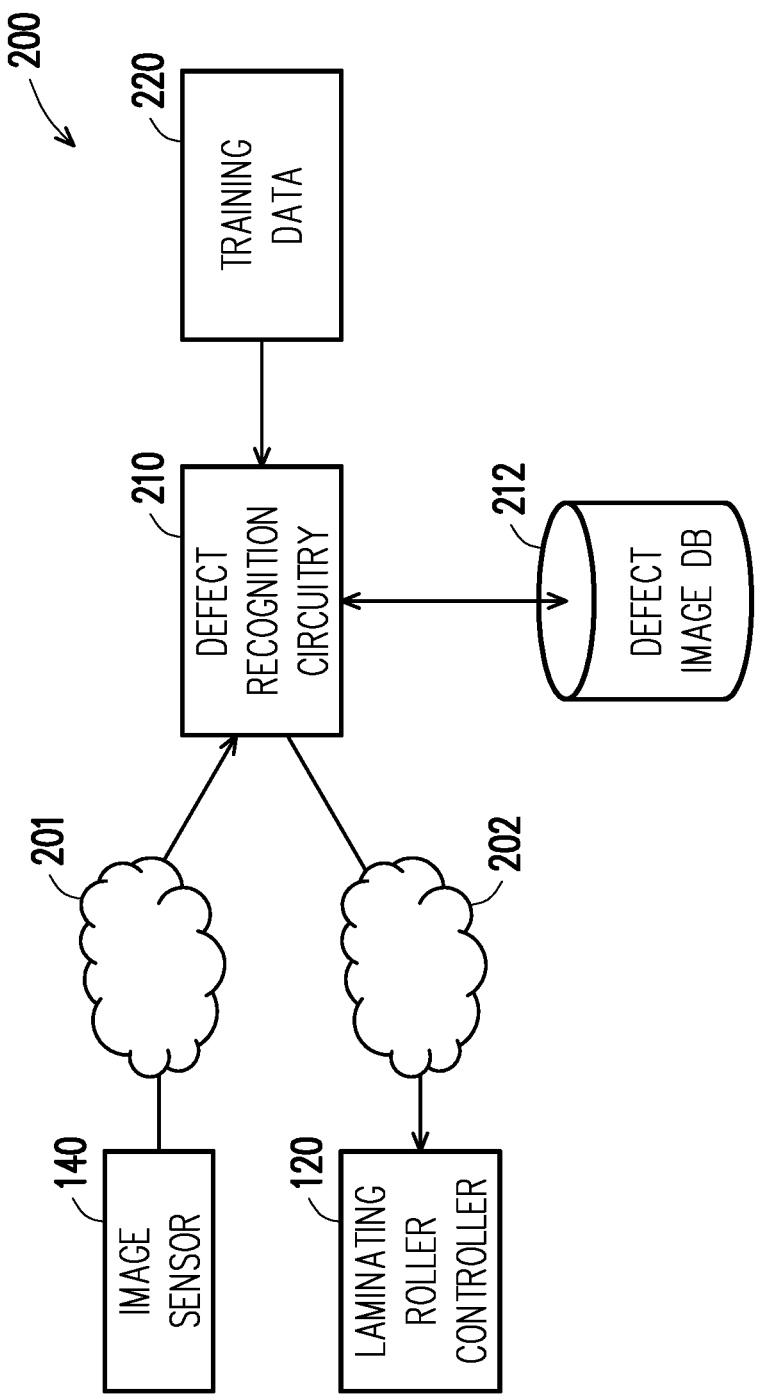
FIG. 2 is a block diagram illustrating a wafer tape defect recognition system, in accordance with some embodiments.

FIG. 2 is a block diagram illustrating a wafer tape defect recognition system 200, in accordance with embodiments of the present disclosure. The wafer tape defect recognition system 200 may be used in conjunction with, and may include one or more of the features and functionality of, the wafer taping apparatus 100 shown in FIG. 1. In some embodiments, the wafer tape defect recognition system 200 is included as a part of the wafer taping apparatus 100. The wafer tape defect recognition system 200 may be utilized to determine, based on the image information acquired by the image sensor 140, the presence of one or more taping defects on the wafer 104, such as a defect in the adhesive tape 105 on the wafer 104.

As shown in FIG. 2, the wafer tape defect recognition system 200 includes defect recognition circuitry 210 and a defect image database 212.

The defect recognition circuitry 210 may include, or otherwise be executed by, a computer processor configured to perform the various functions and operations described herein. For example, the defect recognition circuitry 210 may be executed by a computer processor selectively activated or reconfigured by a stored computer program, or may be a specially constructed computing platform for carrying out the features and operations described herein.

In some embodiments, the defect recognition circuitry 210 includes memory which stores instructions for performing one or more of the features or operations described herein, and the defect recognition circuitry 210 be operable to execute instructions stored, for example, in the memory to perform the functions of the defect recognition circuitry 210 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The image information acquired by the image sensor 140 may be provided to the defect recognition circuitry 210, for example, via a communications network 201. The communications network 201 may utilize one or more protocols to communicate via one or more physical networks, including local area networks, wireless networks, dedicated lines, intranets, the Internet, and the like. In some embodiments, the communications network 201 includes one or more electrical wires which communicatively couple the image sensor 140 to the defect recognition circuitry 210.

The defect recognition circuitry 210 receives the image information acquired from the image sensor 140, and determines whether the received image information indicates the presence of one or more taping defects in the adhesive tape 105 on the wafer 104. In some embodiments, the defect recognition circuitry 210 determines, based on the received image information, a type of defect in the adhesive tape 105 on the wafer 104.

In some embodiments, the defect recognition circuitry 210 may determine the presence and/or type of defects based on the received image information by employing one or more artificial intelligence techniques, which in some embodiments may be implemented at least in part by the defect image database 212. Some or all of the determinations described herein that are made by the defect recognition circuitry 210 may be performed automatically by the defect recognition circuitry 210, for example, in response to receiving the acquired image information.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as image information. Artificially intelligent machines may employ, for example, neural network, deep learning, convolutional neural network, Bayesian program learning, and pattern recognition techniques to solve problems such as defect recognition in an image. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the defect recognition circuitry 210 may learn to determine the presence and/or a type of one or more defects in the adhesive tape 105 and the wafer 104.

The defect image database 212 may include a variety of information facilitating image analysis, with respect to received image information acquired by the image sensor 140, by the defect recognition circuitry 210. In particular, the defect image database 212 may contain image information relating to various defects in an adhesive tape on a wafer. In some embodiments, the defect image database 212 may include information associated with particular types of defects in adhesive tapes applied to wafers, including, for example, bubble defects and non-bubble defects.

Figure 3A:
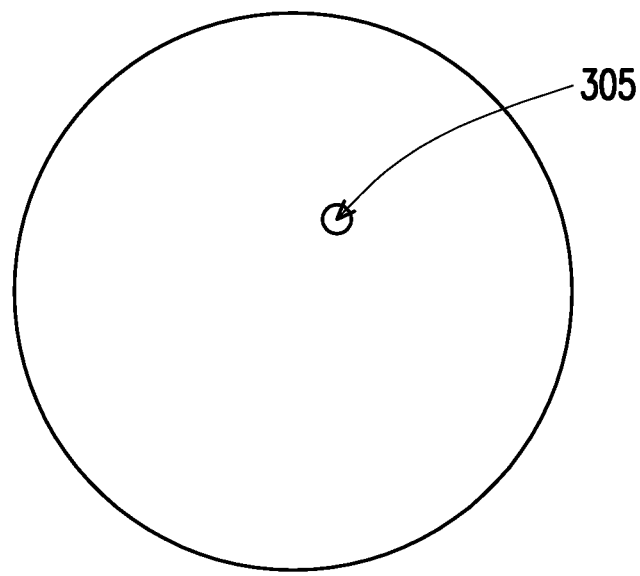
FIG. 3A is a top view illustrating an example bubble type taping defect.
Figure 3B:
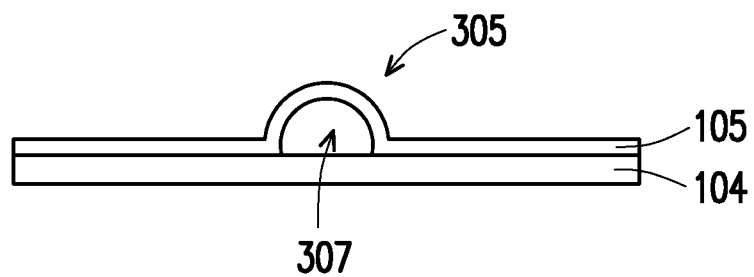
FIG. 3B is a cross-sectional view illustrating the bubble defect shown in FIG. 3A.

A bubble defect is a defect in which a bubble of air or other fluid is trapped between the adhesive tape 105 and the wafer 104. FIG. 3A is a top view illustrating an example bubble defect 305, and FIG. 3B is a cross-sectional view illustrating the bubble defect 305. As shown in FIGS. 3A and 3B, the bubble defect 305 includes a bubble of air 307 between the adhesive tape 105 and the wafer 104. Such a bubble defect 305 may be caused, for example, by insufficient downforce and/or by a speed (e.g., too fast) of the laminating roller 114 during lamination of the adhesive tape 105 to the wafer 104.

Figure 4A:
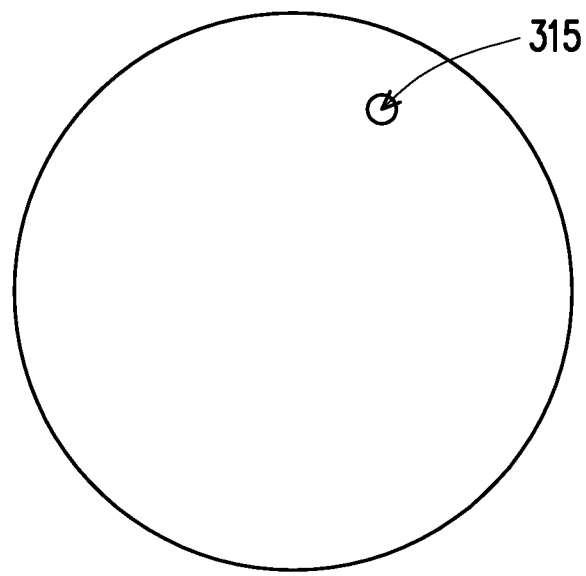
FIG. 4A is a top view illustrating an example non-bubble type taping defect.
Figure 4B:
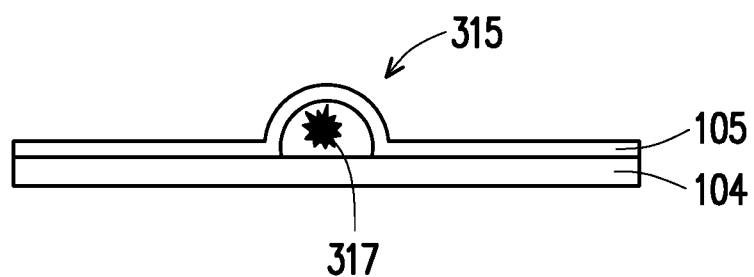
FIG. 4B is a cross-sectional view illustrating the non-bubble defect shown in FIG. 4A.

A non-bubble defect may be any other defect in or between the adhesive tape 105 and the wafer 104, including, for example, a particle between the adhesive tape 105 and the wafer, a bend, fold, or wrinkle of the adhesive tape 105 on the wafer, a hole or other tear in the adhesive tape 105, or the like. FIG. 4A is a top view illustrating an example non-bubble defect 315, and FIG. 4B is a cross-sectional view illustrating the non-bubble defect 315. More particularly, FIGS. 4A and 4B illustrate an example non-bubble defect in the form of a particle 317 between the adhesive tape 105 and the wafer 104.

Figure 5A:
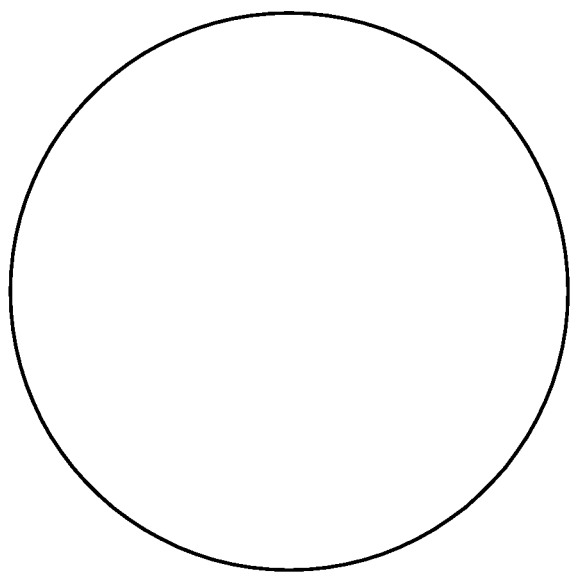
FIG. 5A is a top view illustrating an adhesive tape on a wafer that does not include taping defects.
Figure 5B:
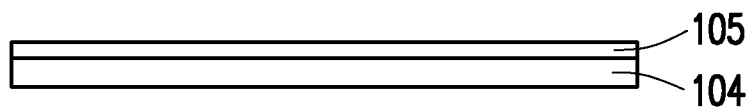
FIG. 5B is a cross-sectional view illustrating the adhesive tape and wafer shown in FIG. 5A.

FIG. 5A is a top view and FIG. 5B is a cross-sectional view illustrating an adhesive tape 105 on a wafer 104 which is free of bubble and non-bubble defects.

Referring again to FIG. 2, the defect image database 212 may contain image information associated with bubble defects (e.g., as shown in FIGS. 3A and 3B) and non-bubble defects (e.g., as shown in FIGS. 4A and 4B), and in some embodiments, the defect image database 212 may further contain image information associated with adhesive tape 105 on a wafer 104 which is free of bubble and non-bubble defects (e.g., as shown in FIGS. 5A and 5B). Each of these three conditions (i.e., bubble defect, non-bubble defect, no defect) may be identifiable based on particular characteristics exhibited, for example, in the images acquired by the image sensor 140. In some embodiments, the conditions (i.e., bubble defect, non-bubble defect, no defect) may be determined based on an optical parameter in the received images, such as an intensity of light that is reflected by particular positions of the adhesive tape 105 and received by the image sensor 140. For example, light that is reflected by a bubble defect 305, light that is reflected by a non-bubble defect 315, and light that is reflected by a defect-free adhesive tape 105 may each have different intensities when received by the image sensor 140.

In some embodiments, the defect recognition circuitry 210 may determine the presence and/or type of defects by analyzing particular characteristics, such as the intensity of light, associated with the image information received from the image sensor 140. The defect recognition circuitry 210 may analyze the characteristics associated with the image information received from the image sensor 140 based on, or otherwise accessing or drawing from, defect image information or learned knowledge stored in the defect image database 212. The defect image database 212 may be stored in any computer-readable storage medium accessible by the defect recognition circuitry 210.

In some embodiments, the defect recognition circuitry 210 may be trained based on training data 220. The training data 220 may include any image information, and in some embodiments, the training data 220 may be labeled training data from which the defect recognition circuitry 210 may learn to detect defects and, in some embodiments, to classify a type of detected defect (e.g., as a bubble or non-bubble defect). For example, the training data 220 may include a variety of training images or image information associated with bubble defects, non-bubble defects, and no defects. Each such training image included in the training data 220 may have slightly different characteristics (e.g., representing different intensities of light), and each training image included in the training data 220 may be labeled, for example, as representing a bubble defect, a non-bubble defect, or no defects. In some embodiments, the training data 220 may include training images representative of two or more defects, which may be bubble defects, non-bubble defects, or some combination of bubble and non-bubble defects.

The training data 220 may further include non-image information which may be provided to the defect recognition circuitry 210 for training. For example, the training data 220 may include manually-entered input, such as one or more variable or adjustable parameters, coefficient values, labels, classifiers, or the like, to adjust or otherwise manage the defect recognition model developed in the defect recognition circuitry 210 through the training process.

The defect recognition circuitry 210 may implement an iterative learning process using the training data 220. Training may be based on a wide variety of learning algorithms or models, including, for example, support vector machines, linear regression, logistic regression, naive Bayes, linear discriminant analysis, decision trees, k-nearest neighbor, neural networks, or the like.

As a result of the training, the defect recognition circuitry 210 may learn to modify its behavior in response to the training data 220, and obtain or generate defect image knowledge which may be stored in the defect image database 212. The defect image knowledge may represent any information upon which the defect recognition circuitry 210 may determine the presence of and/or type of defects in the adhesive tape 105 on the wafer 104. In particular, the defect image knowledge represents relationships between image information (such as may be received from the image sensor 140) and the presence or absence of defects such as bubble defects and non-bubble defects. The defect image knowledge stored in the defect image database 212 may include, for example, information associated with one or more functions, parameters, coefficients, weighting information, parameters associated with a neural network shown, or any variable which may be utilized by the defect recognition circuitry 210 to determine the presence or absence of defects and/or a type of any such defects. In some embodiments, the defect recognition circuitry 210 may further determine a location or position of a detected defect based on the images received from the image sensor 140.

In some embodiments, the defect recognition circuitry 210 is communicatively coupled to the laminating roller controller 120 by a communications network 202. The communications network 202 may be substantially the same as the communications network 201, in some embodiments, and may utilize one or more protocols to communicate via one or more physical networks, including local area networks, wireless networks, dedicated lines, intranets, the Internet, and the like. In some embodiments, the communications network 202 includes one or more electrical wires which communicatively couple the defect recognition circuitry 210 to the laminating roller controller 120.

In response to determining the presence of a defect, the defect recognition circuitry 210 may output control signals to the laminating roller controller 120, which may automatically control one or more operational parameters of the laminating roller 114 based on the determined defect. For example, in a case where the defect recognition circuitry 210 determines the presence of a bubble defect in the adhesive tape 105 on the wafer 104, the defect recognition circuitry 210 may output a control signal to the laminating roller controller 120, and the laminating roller controller 120 may adjust a downforce and/or a lamination speed of the laminating roller 114. Such adjustment may prevent or otherwise reduce the occurrence of bubble defects in subsequent applications of adhesive tape to one or more wafers.

In some embodiments, in response to the defect recognition circuitry 210 determining that the adhesive tape 105 on the wafer 104 is free of defects, the wafer 104 and adhesive tape 105 may be provided to another apparatus (e.g., a back grinding apparatus) or otherwise may be subjected to further processing (e.g., back grinding of the wafer 104).

Figure 6:
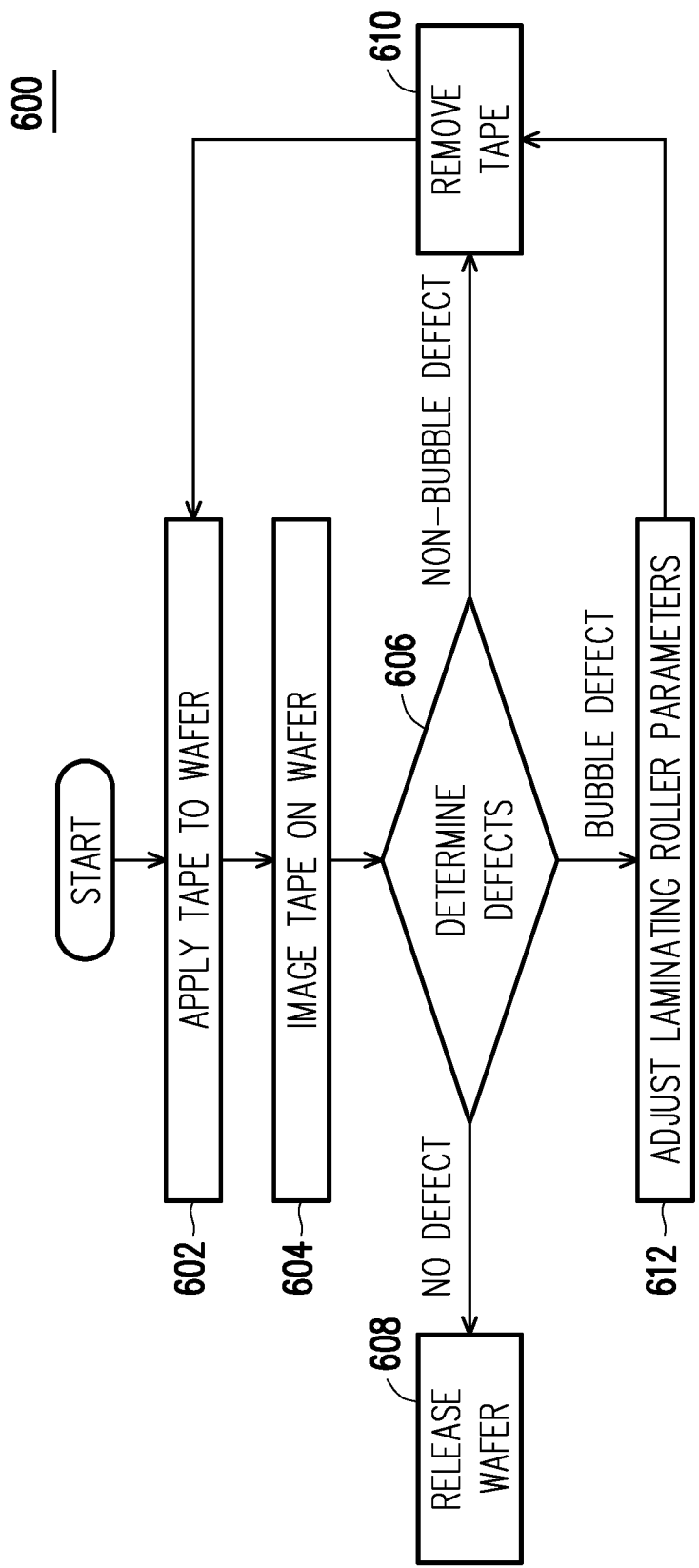
FIG. 6 is a flow chart illustrating a wafer taping method, in accordance with some embodiments.

FIG. 6 is a flowchart illustrating a wafer taping method 600, in accordance with one or more embodiments of the present disclosure. At 602, an adhesive tape 105 is applied to a wafer 104. The wafer 104 may be positioned on a table 102, and the adhesive tape 105 may be applied by the wafer taping apparatus 100, as shown in and described with respect to FIG. 1. For example, tape 106 may be supplied from a tape supply 108, and a liner 107 may be separated from the adhesive tape 105 by a nip roller 110. The adhesive tape 105 may be advanced along the laminating path 113 to a desired position over the wafer 104 on the table 102, and the laminating roller 114 may move over the wafer 104 at a particular speed and with a particular downforce to apply the adhesive tape 105 to a surface (e.g., a front side) of the wafer 104. In some embodiments, the adhesive tape 105 is a back grinding tape which is applied to the wafer 104 prior to back grinding the wafer 104. In some embodiments, applying the adhesive tape 105 to the wafer 104 at 602 further includes cutting the adhesive tape 105 after it has been applied, for example, using the laser head 130.

At 604, the adhesive tape 105 on the wafer 104 is imaged, for example, by the image sensor 140. In some embodiments, the image sensor 140 is a CCD image sensor which acquires one or more images of the adhesive tape 105 on the wafer 104. The acquired images may include image information such as intensities of light reflected by the adhesive tape 105 on the wafer 104 and received by the image sensor 140.

At 606, a presence or absence of defects in the adhesive tape 105 and the wafer 104 is determined, and in some embodiments, a type of any present defects is determined. In some embodiments, the defect recognition circuitry 210 receives image information acquired by the image sensor 140 and determines whether defects are present, and in some embodiments determines a type of any such defects, based on the received image information. The defect recognition circuitry 210 may determine the presence or absence of defects, as well as a type of defects, by employing one or more artificial intelligence techniques, which may be implemented at least in part in conjunction with the defect image database 212. In some embodiments, the defect recognition circuitry 210 determines the presence of defects and/or a type of defects drawing from knowledge that is learned through training of the defect recognition circuitry 210 and stored in the defect image database 212.

In some embodiments, if no defects are detected in the adhesive tape 105 and the wafer 104 (e.g., if the defect recognition circuitry 210 determines that no defects are present), the taped wafer may be released at 608, for example, for further processing such as back grinding of the wafer 104. More particularly, in response to determining that taping defects are not present on the wafer 104, the taped wafer may then proceed to a back grinding process in which a back side or back surface of the wafer 104 is thinned to particular specifications while the front side is protected by the adhesive tape 105.

In some embodiments, if a non-bubble defect is detected, for example, between the adhesive tape 105 and the wafer 104, then the adhesive tape 105 is removed as shown at 610. Removing the tape at 610 may be performed by any technique which suitably removes the adhesive tape 105 from the wafer 104, and in some embodiments, removing the tape at 610 may further include preparing the wafer 104 for a new application of tape. In some embodiments, the adhesive tape 105 may be removed from the wafer 104 using a tape removal apparatus capable of removing the adhesive tape 105 without causing damage to electrical features on or adjacent to the front side of the wafer 104. In some embodiments, removal of the adhesive tape 105 from the wafer 104 may include treating the adhesive tape 105 with ultraviolet (UV) irradiation to decrease the adhesive strength of the adhesive tape 105 and thereby facilitate easy removal without placing additional stress on the wafer 104 while peeling off the adhesive tape 105.

Once the adhesive tape 105 has been removed from the wafer 104, the wafer 104 may be re-taped, for example, at 602 in which a new layer of adhesive tape 105 is applied to the wafer 104. The method 600 may then proceed as previously described, for example, the new layer of adhesive tape 105 on the wafer 104 may be imaged at 604, and defects may be determined at 606.

In some embodiments, if a bubble defect is detected at 606, then one or more operational parameters of the laminating roller 114 may be adjusted at 612. For example, when the defect recognition circuitry 210 determines the presence of a bubble defect in the adhesive tape 105 on the wafer 104, the defect recognition circuitry 210 may output a control signal to the laminating roller controller 120, and the laminating roller controller 120 may adjust a downforce and/or a lamination speed of the laminating roller 114. In some embodiments, the downforce applied by the laminating roller 114 is increased in response to a bubble defect being detected at 606. In some embodiments, the speed at which the laminating roller 114 moves over the adhesive tape 105 while pressing the adhesive tape 105 to the wafer may be decreased in response to a bubble defect being detected at 606. By adjusting the operational parameters of the laminating roller 114 at 612, the occurrence of bubble defects may be prevented or reduced in subsequent applications of adhesive tape to wafers, for example, at 602.

The method 600 proceeds to 610, in which the adhesive tape 105 is removed from the wafer 104, thereby removing the bubble defect. Once the adhesive tape 105 has been removed from the wafer 104, the wafer 104 may be re-taped, for example, at 602 in which a new layer of adhesive tape 105 is applied to the wafer 104 using the adjusted operational parameters of the laminating roller 114. The method 600 may then proceed as previously described, for example, the new layer of adhesive tape 105 on the wafer 104 may be imaged at 604, and defects may be determined at 606.

In some embodiments, the wafer 104 may be categorized as a non-process wafer in response to detecting the presence of either bubble or non-bubble defects at block 606. For example, the wafer 104 may proceed to 610, in which the adhesive tape 105 is removed from the wafer 104, and the wafer 104 may then be placed in a slot, for example of a wafer carrier or the like, indicating that the wafer 104 is not currently being processed, but instead is a non-process wafer awaiting further processing. Accordingly, another wafer may proceed to be processed, e.g., by the wafer taping method 600.

The present disclosure provides, in various embodiments, apparatuses and methods that may be utilized to automatically determine whether taping defects are present on a taped semiconductor wafer. This results in cost and time savings, since the taped wafer can be inspected by machinery instead of by a visual inspection performed by a human. Additionally, the apparatuses and methods described by the present disclosure facilitate improved and more consistent inspection for taping defects as the inspection does not rely on variations in human judgment and reduces or eliminates errors introduced by such human judgment.

According to one embodiment, a method includes applying an adhesive tape on a surface of a semiconductor wafer. An imaging device, which may be positioned over the semiconductor wafer, acquires image information associated with the adhesive tape on the semiconductor wafer. The method further includes determining, by defect recognition circuitry, whether a taping defect is present on the semiconductor wafer based on the acquired image information.

According to another embodiment, an apparatus is provided that includes a laminating roller configured to apply tape to a surface of a wafer. An imaging device is configured to acquire image information associated with the tape on the wafer. The apparatus further includes defect recognition circuitry that is configured to determine, based on the acquired image information, whether a taping defect is present on the wafer.

According to yet another embodiment, a wafer processing method is provided that includes receiving a semiconductor wafer. A laminating roller applies an adhesive tape on a first surface of the semiconductor wafer, and an imaging device acquires image information associated with the adhesive tape on the semiconductor wafer and outputs the image information to defect recognition circuitry. The defect recognition circuitry determines whether a taping defect is present on the semiconductor wafer based on the image information. The method further includes grinding a second surface of the semiconductor wafer, opposite the first surface, in response to determining that the semiconductor wafer is free of taping defects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
 applying an adhesive tape on a surface of a semiconductor wafer arranged on a wafer table, the applying the adhesive tape including positioning the adhesive tape over the surface of the semiconductor wafer and pressing the adhesive tape to the surface of the wafer by moving a laminating roller over the adhesive tape along a first direction;
 acquiring, by an imaging device positioned over the semiconductor wafer on the wafer table, image information associated with the adhesive tape on the semiconductor wafer, the laminating roller disposed between the imaging device and the semiconductor wafer along a second direction that is transverse to the first direction;
 accessing, by defect recognition circuitry, defect image information stored in a defect image database, the defect image information including image information associated with bubble defects in which a bubble of a fluid is trapped between the adhesive tape and the semiconductor wafer and non-bubble defects in or between the adhesive tape and the semiconductor wafer; and determining, by the defect recognition circuitry, whether a taping defect is present on the semiconductor wafer based on the acquired image information and the accessed defect image information, the defect recognition circuitry configured to implement at least one artificial intelligence model that is trained, based on training image information associated with taping defects, to determine taping defects.

2. The method of claim 1, further comprising:
adjusting an operational parameter of the laminating roller in response to determining that a taping defect is present on the semiconductor wafer.

3. The method of claim 2 wherein the adjusting an operational parameter of the laminating roller includes adjusting at least one of a laminating roller downforce or a laminating roller speed.

4. The method of claim 1, further comprising:
determining, based on the acquired image information, a type of the taping defect on the semiconductor wafer, in response to determining that a taping defect is present on the semiconductor wafer.

5. The method of claim 4 wherein the determining a type of taping defect on the semiconductor wafer includes determining whether at least one of a bubble defect or a non-bubble defect is present on the semiconductor wafer.

6. The method of claim 5, the method further comprising:
adjusting at least one of a laminating roller downforce or a laminating roller speed in response to determining a bubble defect is present on the semiconductor wafer.

7. The method of claim 6, further comprising:
removing the adhesive tape from the semiconductor wafer;
applying a second adhesive tape on the surface of the semiconductor wafer;
acquiring, by the imaging device, second image information associated with the second adhesive tape; and
determining, by the defect recognition circuitry, whether a taping defect is present on the semiconductor wafer based on the acquired second image information.

8. The method of claim 5, further comprising:
removing the adhesive tape from the semiconductor wafer in response to determining a non-bubble defect is present on the semiconductor wafer;
applying a second adhesive tape on the surface of the semiconductor wafer;
acquiring, by the imaging device, second image information associated with the second adhesive tape; and
determining, by the defect recognition circuitry, whether a taping defect is present on the semiconductor wafer based on the acquired second image information.

9. The method of claim 1 wherein the at least one artificial intelligence model includes a neural network.

10. The method of claim 9 wherein the defect image information stored in the defect image database includes at least one of coefficients or weighting information associated with the neural network.

11. A wafer processing method, comprising:
receiving a semiconductor wafer;
applying, by a laminating roller, an adhesive tape on a first surface of the semiconductor wafer while a second surface of the semiconductor wafer is disposed on a wafer table, the applying the adhesive tape including positioning the adhesive tape over the first surface of the semiconductor wafer and pressing the adhesive tape to the first surface of the wafer by moving the laminating roller over the adhesive tape along a first direction;

acquiring, by an imaging device positioned over the semiconductor wafer while the semiconductor wafer is disposed on the wafer table, image information associated with the adhesive tape on the semiconductor wafer, the laminating roller disposed between the imaging device and the semiconductor wafer along a second direction that is transverse to the first direction;

outputting the image information to defect recognition circuitry;

accessing, by the defect recognition circuitry, defect image information stored in a defect image database, the defect image information including image information associated with bubble defects in which a bubble of a fluid is trapped between the adhesive tape and the semiconductor wafer and non-bubble defects in or between the adhesive tape and the semiconductor wafer;

determining, by the defect recognition circuitry, whether a taping defect is present on the semiconductor wafer based on the image information and the accessed defect image information, the defect recognition circuitry configured to implement at least one artificial intelligence model that is trained, based on training image information associated with taping defects, to determine taping defects; and grinding the second surface of the semiconductor wafer, in response to determining that the semiconductor wafer is free of taping defects.

12. The method of claim 11 wherein determining whether a taping defect is present on the semiconductor wafer includes determining whether at least one of a bubble defect or a non-bubble defect is present on the semiconductor wafer.

13. The method of claim 12, further comprising:
adjusting at least one of a downforce or a speed of the laminating roller in response to determining a bubble defect is present on the semiconductor wafer.

14. The method of claim 11, further comprising:
removing the adhesive tape from the semiconductor wafer in response to determining a taping defect is present on the semiconductor wafer;
applying a second adhesive tape on the first surface of the semiconductor wafer;
acquiring, by the imaging device, second image information associated with the second adhesive tape; and
determining, by the defect recognition circuitry, whether a taping defect is present on the semiconductor wafer based on the second image information.

15. The method of claim 11 wherein the at least one artificial intelligence model includes a neural network.

16. A method, comprising:
applying, by a laminating roller, a tape to a surface of a wafer while the wafer is arranged on a wafer table, the applying the tape including positioning the tape over the surface of the wafer and pressing the tape to the surface of the wafer by moving the laminating roller over the tape along a first direction;

acquiring, by an imaging device positioned over the wafer on the wafer table, image information associated with the tape on the wafer, the laminating roller disposed between the imaging device and the wafer along a second direction that is transverse to the first direction, the image information including image information associated with bubble defects in which a bubble of a fluid is trapped between the adhesive tape and the semiconductor wafer and non-bubble defects in or between the adhesive tape and the semiconductor wafer;

accessing, by defect recognition circuitry, defect image information stored in a defect image database;

determining, by the defect recognition circuitry, whether a taping defect is present on the wafer based on the acquired image information and the accessed defect image information, the defect recognition circuitry configured to implement at least one artificial intelligence model that is trained, based on training image information associated with taping defects, to determine taping defects; and adjusting, by a controller communicatively coupled to the defect recognition circuitry, an operational parameter of the laminating roller in response to the defect recognition circuitry determining that a taping defect is present on the wafer.

17. The method of claim 16, further comprising:
cutting the tape by a laser head positioned over the wafer, wherein the imaging device is mounted to the laser head.

18. The method of claim 16 wherein the adjusting the operational parameter of the laminating roller includes adjusting at least one of a laminating roller downforce or a laminating roller speed.

19. The method of claim 16 wherein the determining whether a taping defect is present on the wafer includes determining whether at least one of a bubble defect or a non-bubble defect is present on the wafer.

20. The method of claim 19, further comprising:
removing the tape from the wafer in response to determining that a non-bubble defect is present on the wafer.

* * * * *